US010529771B2

(12) United States Patent
Borg et al.

(10) Patent No.: US 10,529,771 B2
(45) Date of Patent: Jan. 7, 2020

(54) ARRAY OF OPTOELECTRONIC STRUCTURES AND FABRICATION THEREOF

(71) Applicant: International Business Machines Corporation, Armonk, NY (US)

(72) Inventors: Mattias B. Borg, Adliswil (CH); Lukas Czornomaz, Zurich (CH); Veeresh V. Deshpande, Zurich (CH); Vladimir Djara, Kilchberg (CH); Heike E. Riel, Baech (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/906,316

(22) Filed: Feb. 27, 2018

(65) Prior Publication Data
US 2018/0190693 A1 Jul. 5, 2018

Related U.S. Application Data

(63) Continuation of application No. 15/200,753, filed on Jul. 1, 2016, now Pat. No. 9,923,022.

(51) Int. Cl.
*H01L 27/146* (2006.01)
*H01S 5/40* (2006.01)
(Continued)

(52) U.S. Cl.
CPC ...... *H01L 27/1469* (2013.01); *H01L 27/1465* (2013.01); *H01L 27/14636* (2013.01);
(Continued)

(58) Field of Classification Search
None
See application file for complete search history.

(56) References Cited

U.S. PATENT DOCUMENTS 7,687,372 B2 3/2010 Jain
8,674,377 B2 3/2014 Farquhar
(Continued)

OTHER PUBLICATIONS

Torfi, "Fabrication and Characterization of Optoelectronics Devices Based on III-V Materials for Infrared Applications by Molecular Beam Epitaxy", Dissertation, Ph.D., Columbia University, 2012, http://hdl.handle.net/10022/AC:P:14908, pp. 1-100.
(Continued)

*Primary Examiner* — Zandra V Smith
*Assistant Examiner* — Lawrence C Tynes, Jr.
(74) *Attorney, Agent, or Firm* — Scully, Scott, Murphy & Presser, P.C.; Daniel Morris, Esq.

(57) ABSTRACT

A method of fabrication of an array of optoelectronic structures includes first providing a crystalline substrate having cells corresponding to individual optoelectronic structures to be obtained. Each of the cells includes an opening to the substrate. Then, several first layer portions of a first compound semiconductor material are grown in each the opening to at least partly fill a respective one of the cells and form an essentially planar film portion therein. Next, several second layer portions of a second compound semiconductor material are grown over the first layer portions that coalesce to form a coalescent film extending over the first layer portions. Finally, excess portions of materials are removed, to obtain the array of optoelectronic structures. Each optoelectronic structure comprises a stack protruding from the substrate of: a residual portion of one of the second layer portions; and a residual portion of one of the first layer portions.

19 Claims, 4 Drawing Sheets

(51) Int. Cl.
  *H01S 5/30* (2006.01)
  *H01L 27/148* (2006.01)
  *H01L 31/0304* (2006.01)
  *H01S 5/026* (2006.01)
  *H01S 5/02* (2006.01)
  *H01L 31/12* (2006.01)

(52) U.S. Cl.
  CPC .. *H01L 27/14694* (2013.01); *H01L 27/14881* (2013.01); *H01L 31/03046* (2013.01); *H01L 31/12* (2013.01); *H01S 5/021* (2013.01); *H01S 5/0262* (2013.01); *H01S 5/3013* (2013.01); *H01S 5/4025* (2013.01)

(56) References Cited

U.S. PATENT DOCUMENTS

| | | |
|---|---|---|
| 8,994,004 B2 | 3/2015 | Bowers |
| 9,065,010 B2 | 6/2015 | Forrest et al. |
| 2010/0127238 A1* | 5/2010 | Kim .................. H01L 33/387 257/13 |
| 2011/0291120 A1 | 12/2011 | Tak et al. |
| 2012/0187430 A1 | 7/2012 | West et al. |
| 2014/0252313 A1 | 9/2014 | Mariani et al. |
| 2016/0197225 A1 | 7/2016 | Payne |
| 2016/0233647 A1 | 8/2016 | Liu et al. |
| 2016/0351391 A1* | 12/2016 | Borg ................ H01L 21/02546 |

OTHER PUBLICATIONS

List of IBM Patents or Patent Applications Treated as Related, dated Feb. 16, 2018, 2 pages.

\* cited by examiner

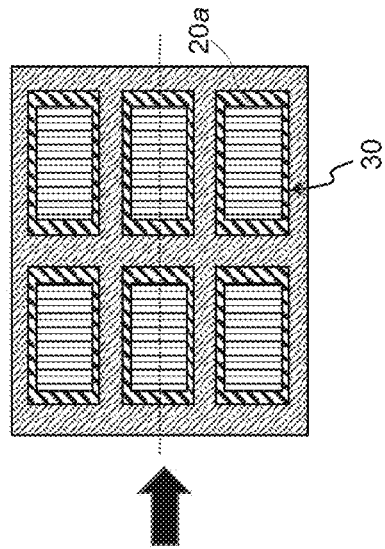
FIG. 3A
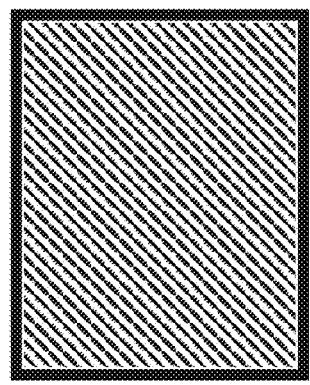
FIG. 3B
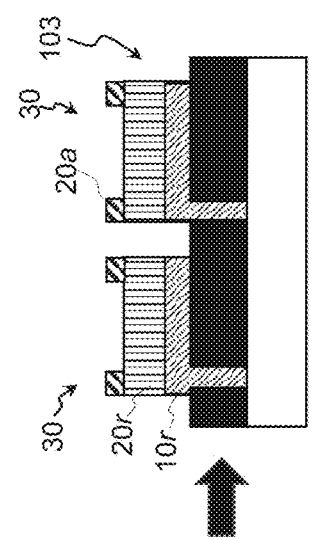
FIG. 3C
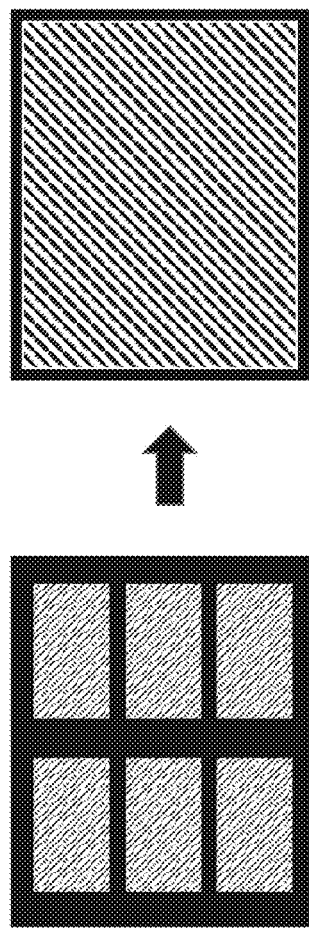
FIG. 4A
FIG. 4B
FIG. 4C

ARRAY OF OPTOELECTRONIC STRUCTURES AND FABRICATION THEREOF

BACKGROUND

The present disclosure relates in general to the field of optoelectronic devices, which comprise an array of multi-layered optoelectronic structures, and methods of fabrication of such devices. In particular, it concerns methods of fabrication of optoelectronic structures comprising multiple layers of III-V compound semiconductors on Silicon.

As of today, optical sensors as used in most charge-coupled device (CCD) cameras are based on Si photosensitive elements. Integration on complementary metal-oxide semiconductor (CMOS) circuitry is straightforward and excellent sensitivity is achieved in the visible regime.

However, longer wavelength (e.g., infrared) detection on Si is not possible. For long wavelength detection, solutions are known which involve a III-V compound semiconductor material bonded on a Si-CMOS readout chip. Yet, such solutions remain expensive in practice and preclude volume manufacturing.

Attempts to directly grown III-V on Si have been reported. Such attempts were not successful due to various crystal defects they beget, which substantially limit photocurrent detection.

SUMMARY

According to a first aspect, there is provided a method of fabrication of an array of optoelectronic structures. The method first comprises providing a crystalline substrate with a template structure thereon, wherein the template structure comprises cells corresponding to individual optoelectronic structures to be obtained. Each of the cells comprises an opening to the substrate. Then, several first layer portions of a first compound semiconductor material are grown from seeds in each opening of the cells, so as for each of said first layer portions to a least partly fill a respective one of the cells and form an essentially planar film portion therein. Next, several second layer portions of a second compound semiconductor material are grown over said first layer portions, so as for neighboring ones of said second layer portions to coalesce and thereby form a coalescent film extending over said first layer portions. Finally, excess portions (or regions) of materials are removed, to obtain said array of optoelectronic structures. The excess portions are portions that initially extend over the substrate, vis-à-vis lateral boundaries of the cells. Each of the optoelectronic structures obtained comprises a stack protruding from the substrate, where the stack comprises a residual portion of one of said second layer portions and a residual portion of one of said first layer portions.

Said second layer portions are preferably grown so as for said neighboring ones of said second layer portions to coalesce vis-à-vis the lateral boundaries of the cells and form defective regions vis-à-vis said lateral boundaries.

In a first class of embodiments, the lateral boundaries of the cells are explicitly defined, thanks to by walls of the template structure, wherein said walls extend perpendicularly to an average plane of the substrate. The first layer portions are accordingly grown so as for said first layer portions to reach said walls, which form gaps between neighboring ones of the first layer portions grown.

In a second class of embodiments, no such walls need be provided. The first layer portions are grown so as for neighboring portions to coalesce vis-à-vis is the lateral boundaries of the cells and thereby form a first coalesced film. This film comprises first defective regions vis-à-vis said lateral boundaries. In addition, the second layer portions are grown so as to form a second coalescent film extending over said first coalesced film. The second film obtained will typically exhibit second defective regions vis-à-vis the first defective regions, i.e., vis-à-vis the lateral boundaries.

If necessary, the present methods may include a step of removing upper portions of the template structure to expose the first layer portions of first compound semiconductor material, prior to grow the second layer portions.

According to another aspect, there is provided an optoelectronic device comprising an array of optoelectronic structures obtained according to the present methods. In embodiments, a subset of the optoelectronic structures may be configured, each, as a photodetector. In variants, optoelectronic structures may be configured as a light-emitting device, e.g., as a semiconductor laser.

Devices and fabrication methods embodying the present invention will now be described, by way of non-limiting examples, and in reference to the accompanying drawings.

BRIEF DESCRIPTION OF SEVERAL VIEWS OF THE DRAWINGS

FIGS. 1A-1F illustrate high-level steps of a fabrication method according to embodiments;

FIGS. 2A-2F depict high-level steps of a fabrication method, according to a variant to FIG. 1;

FIGS. 3A to 3C show, each, a top view of yet another optoelectronic device, at various stages of its fabrication. FIGS. 4A-4C show corresponding 2D cross-sectional views. FIGS. 3 and 4 depict high-level steps of a fabrication method, according to another variant;

Figure 1A:
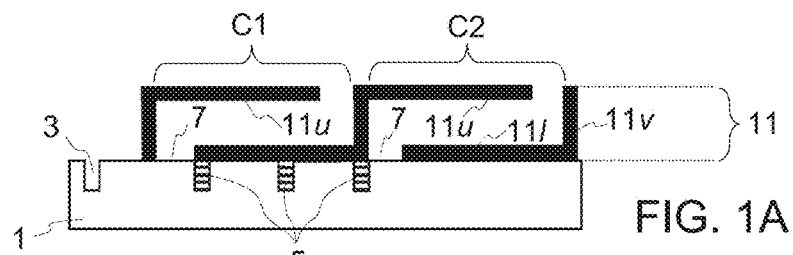
FIGS. 1A to 1F show, each, a 2D cross-sectional view of an optoelectronic device, at various stages of its fabrication.

The accompanying drawings show simplified representations of devices or parts thereof, as involved in embodiments. Technical features depicted in the drawings are not to scale. Similar or functionally similar elements in the figures have been allocated the same numeral references, unless otherwise indicated.

DETAILED DESCRIPTION

The following description is structured as follows. First, general embodiments and high-level variants are described (sect. 1). The next section addresses more specific embodiments and technical implementation details (sect. 2).

1. General Embodiments and High-Level Variants

Referring generally to FIGS. 1-6, a first aspect of the present disclosure is described, which concerns a method of fabrication of an array 100-103 of optoelectronic structures 30.

Figure 1B:
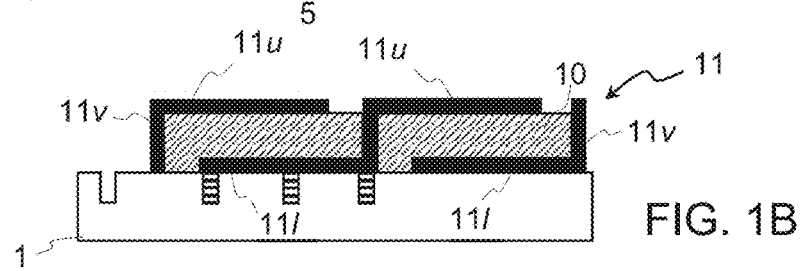
Figure 1C:
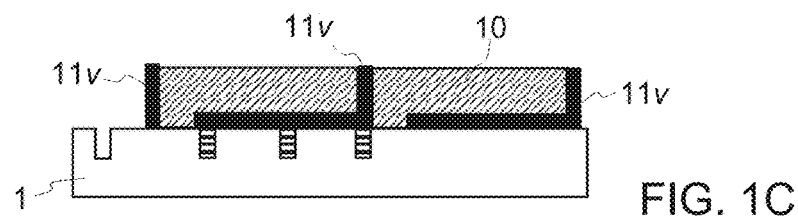
Figure 1D:
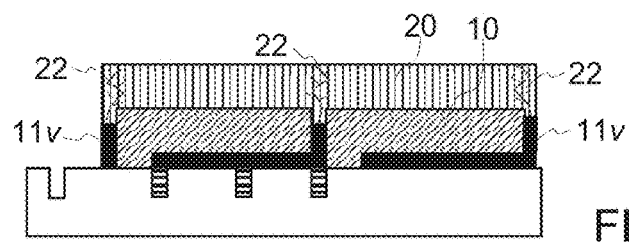
Figure 1E:
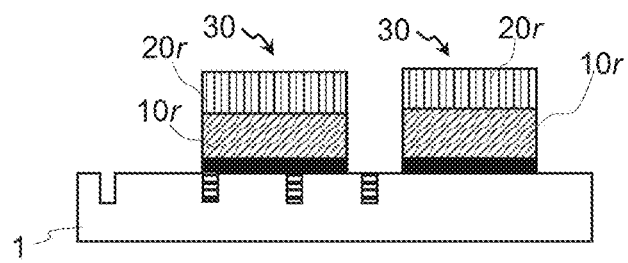
Figure 1F:
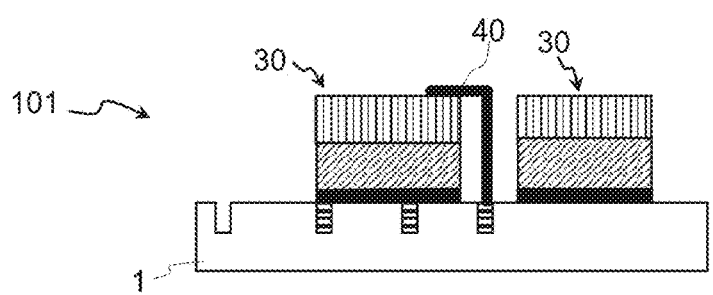
Figure 2A:
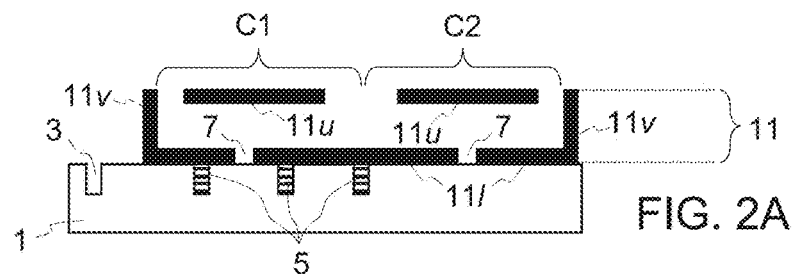
FIGS. 2A to 2F show, each, a 2D cross-sectional view of another optoelectronic device, at various stages of fabrication.

Basically, the method relies on a crystalline substrate 1, which comprises a template structure 11 already patterned or structured thereon, as depicted in FIGS. 1A, 2A. The template structure comprises cells C1, C2 (see FIGS. 1 and 2), which correspond to individual optoelectronic structures 30 to be eventually obtained. The template structure may be provided, e.g., in the shape of sheets/tiles, so as to define cells, e.g., objects defined by respective cavities (roughly) delimiting the optoelectronic structures 30 to be obtained in fine. But more importantly, the cells comprise respective openings 7 to the substrate 1 (i.e., apertures), from which epitaxial growth can be started. These openings are the objects that primarily define the cells, as we shall see.

The cells are typically parallelepiped (e.g., they have square or rectangle cross-section). Each of the cells C1, C2 comprise an opening 7 to the substrate 1. Each cell preferably comprise only one aperture, for reasons that will become apparent later. Note that the pedagogical examples shown in FIGS. 1-4 assume only two neighboring cells, in cross-section, for the sake of simplicity and without prejudice. Several rows of more than two optoelectronic structures 30 shall typically be contemplated in practice, as in typical CCD applications.

Figure 2B:
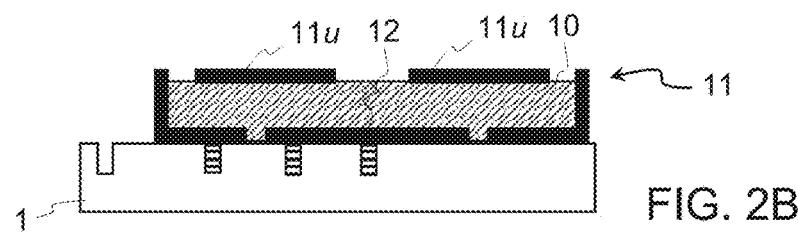

Then, several first layer portions 10 of a first compound semiconductor material are grown (e.g., epitaxially) from seeds initially deposited in the openings 7. The growth is generally controlled so as for each of the first layer portions 10 to a least partly fill a respective one of the cells C1, C2 and form an essentially planar film portion therein, as depicted in FIGS. 1B, 2B.

Next, several, second layer portions 20 of a second compound semiconductor material 20 are (epitaxially) grown over said first layer portions 10. This step is carried out so as for neighboring portions 20 to coalesce and thereby form a coalescent film 20. The latter extends over the first layer portions 10, as previously obtained, see FIGS. 1D, 2D. The film 20 typically the active material, for optoelectronic applications as discussed below.

Figure 5:
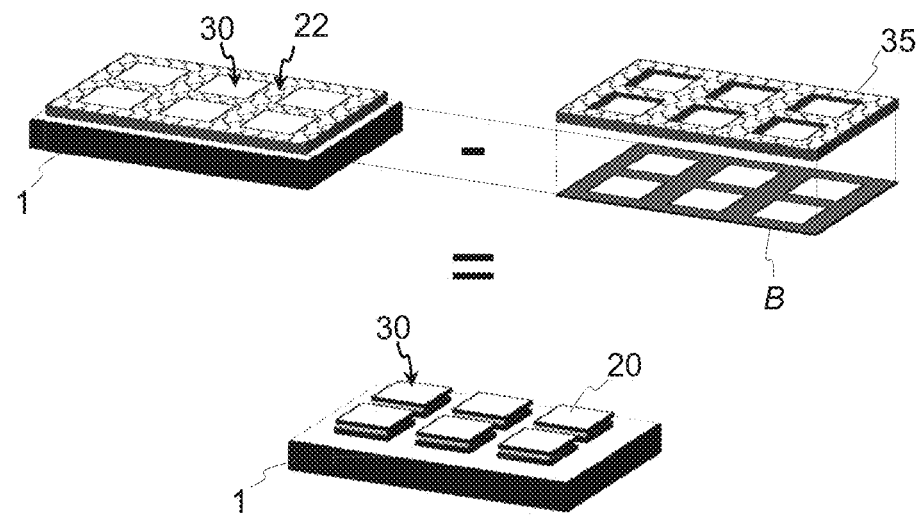
FIG. 5 shows 3D views of a device, or parts thereof, illustrating how excess portions of materials can be removed to obtain an array of optoelectronic structures, as involved in embodiments.
Figure 6:
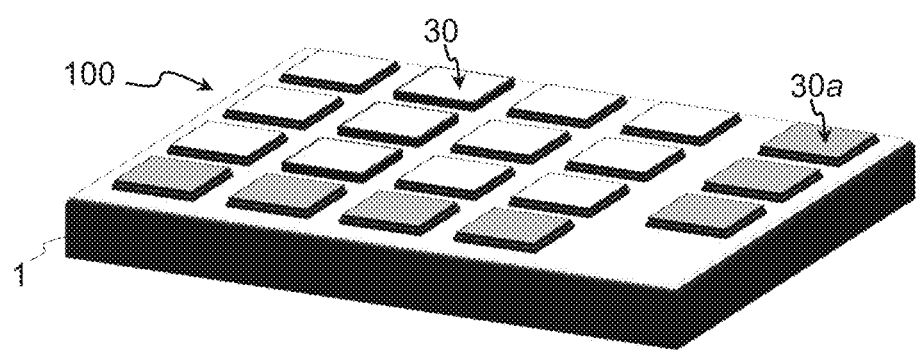
FIG. 6 is a 3D view of an optoelectronic device, according to embodiments.

Finally, excess portions of materials are removed, to obtain the desired array of optoelectronic structures 30 (compare FIG. 1D to FIG. 1E and FIG. 2D to FIG. 2E). The removal of an excess structure 35 is symbolically depicted in FIG. 5. "Excess" portions of materials denote material portions, or regions, that exceed the prescribed or desired dimensions of the target structures 30. In the present case, the excess portions 35 correspond to material that initially extends over the substrate 1, vis-à-vis lateral boundaries B of the cells C1, C2. As illustrated in FIG. 5, since such boundaries B are primarily defined by the in-plane pattern formed by the openings 7, these are most naturally defined in a plane parallel to the average plane of the substrate 1. Thus, the lateral boundaries B are defined in-plane. They are further assumed to have a certain "thickness", which, in turn, determine the volume of excess portions 35 to be removed from the material portions facing them, as symbolically depicted in FIG. 5. Typically, the portions 35 to be removed initially include outer, lateral portions (e.g., peripheral portions) of the materials 10, 20 in (or at the level of) each cell C1, C2, i.e., materials forming "walls" of the cells.

Figure 2C:
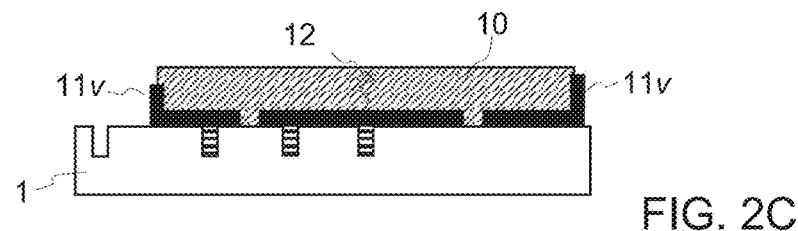
Figure 2D:
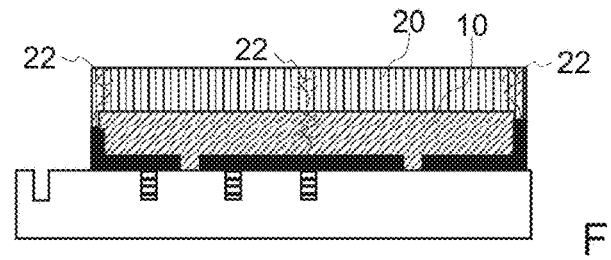

In particular, it is advantageous to specifically remove defective portions 12, 22, i.e., those portions formed at the interface between two neighboring cells, which may comprise crystalline defects, owing to the fabrication methods used, in embodiments, see FIGS. 1D and 2D. In FIG. 5, defective regions 22 of the upper layer 20 are represented. Of course, the scale assumed in FIG. 5 is not realistic, as the skilled person may appreciate. In addition, the (essentially defect-free) regions corresponding to the target structures 30 are not abruptly separated from defective regions 22, as FIG. 5 would suggest. In reality, the defect density varies smoothly, and will, on average, be substantially higher in the coalescence regions, which is the reason why each cell preferably comprise only one aperture (i.e., one aperture 7 is provided for each pixel one wants to eventually obtain). What FIG. 5 aims at illustrating is that one preferably attempts to remove excess portions 35 where the defect density is the highest. These excess portions 35 are ideally as small as possible, so that a dense arrangement of structures 30 can eventually be obtained, as in embodiments. As discussed further below, the excess material portions 35 may further include excess portions of lower sections 11$l$, 11$v$ of the template structure 11, as well as excess portions 12 of intermediate layers 10 (which are not visible in FIG. 5). In particular, the excess material removed may possibly include material about or defining the openings 7.

As further seen in FIG. 5, the excess structure 35 may be regarded as a honeycomb structure, i.e., comprising a higher defect density than the (essentially) defect-free regions 30, which results from the fabrication process used. The excess structure 35 depicted in FIG. 5 is similar to what results from the process of FIGS. 2A-2D. The excess structure 35 corresponds to those portions that need be removed, in order to obtain clean residual structures 30. The defective regions 35 can notably be removed using chemical or plasma-based methods, e.g., wet etching or plasma etching, to obtain the desired, neat, protruding structures 30.

So far, the lateral boundaries B (see FIG. 5) were essentially conceptual objects, primarily defined by the pattern formed by the openings 7. Yet, cell lateral boundaries may be explicitly formed by lateral walls 11$v$ of the template structure 11. A lateral wall 11$v$ of the template structure 11 is a portion or part of the structure 11 that extends perpendicularly to an average plane of the substrate 1. In particular, the lateral walls 11$v$ may include inter-cell walls, i.e., middle-walls separating two neighboring cells, as in the example of FIG. 1.

In variants, no such inter-cell walls are needed, as illustrated in FIG. 2, in which case the cells are essentially defined by the openings 7, in addition to outer walls 11$v$ surrounding the layer 10. In each case, however, the openings 7 are arranged according to the array of structures 30 to be eventually obtained. The openings 7 accordingly form a pattern, which can be regarded as subtending cells of the array that one wants to eventually obtain.

As a result of the above steps, an array of optoelectronic structures 30 is obtained, wherein each optoelectronic structure 30 comprises a stack of residual portions 10$r$, 20$r$, which stack protrudes from the substrate 1. Namely, each optoelectronic structure 30 as finally obtained comprises a residual portion 20$r$ of one of said second layer portions 20, as well as a residual portion 10$r$ of one of said first layer portions 10. "Optoelectronic structures" refer to protruding, layered structures 30, whose dimensions, compositions and quality yield optical properties that may advantageously be exploited in applications, as discussed later in detail.

Present methods allow a (possibly dense) array of optoelectronic structures 30 to be obtained, wherein the structures 30 comprises planar, well-defined and (essentially) defect-free layer portions 10$r$, 20$r$ of compound semiconductor materials. The quality of the structures 30 finally obtained can be characterized, e.g., in terms of fraction of defects. For instance, scanning transmission electron microscope (STEM) techniques can be used to detect threading dislocations. As it turns out, the threading dislocation density in the bulk of the structures 30 eventually obtained is very small, possibly zero. "Essentially" defect-free means that most of the layer portions 10r, 20r form crystal lattices that are continuous, unbroken and free of grain boundaries. In particularly advantageous embodiments, III-V materials are grown on a Si substrate, with limited crystal defects, leading to satisfactory photo-current detection.

The first growth (FIGS. 1B, 2B) is preferably performed as a selective area epitaxial growth, i.e., as a local growth of epitaxial layers 10, 20, performed within the template, by leveraging openings 7. Growth conditions are selected to ensure epitaxial growth, first on the substrate exposed through the aperture 7, and then, or concomitantly, on lower portions 11l of the template structure 11. A lower portion 11l of the template structure is a portion that extends parallel to an average plane of the substrate 1 and is in mechanical contact therewith. Apertures 7 need not necessarily be cylindrical or parallelepiped, notwithstanding the depictions in the appended drawings. For instance, they may have a tronconic shape. An opening 7 may be located at the middle of a cell (as in FIG. 2), or not (as in FIG. 1). Each implementation has benefits. Side apertures are easy to be removed, e.g., to block a current path to the substrate, if needed. Using central apertures, structures twice the size can be grown in the same time (all things otherwise equal), for example.

The subsequent growth step(s), see FIGS. 1D, 2D, 4B, which aim(s) at obtaining a coalescent film 20, can be performed as, or similar to a regular blanket overgrowth, e.g., to form a planar film of a III-V compound semiconductor material(s) with well controlled composition(s). In particular, the subsequent growth steps may be performed by growing several layer portions 20, so as for neighboring portions 20 to coalesce vis-à-vis lateral boundaries B of the cells. Coalesced portions 20 will accordingly form defective regions 22 vis-à-vis the lateral boundaries B. Yet, since such portions are later trimmed, see FIGS. 1E, 2E, they do not impact the quality of the structures 30 eventually obtained.

Referring now more specifically to FIG. 1, a first class of embodiments is described, wherein lateral boundaries B of the cells C1, C2 are notably defined by walls 11v of the template structure 11. Such walls essentially extend perpendicularly to the average plane of the substrate 1. As evoked above, walls 11v may notably be provided between adjacent cells, to physically separate the cells at the level of the first layer portions 10. Thus, as layers 10 grow up (FIG. 1B), they reach lateral walls 11v, including walls that form gaps between neighboring cells. Note that the middle walls extend vis-à-vis lateral boundaries as defined earlier in reference to FIG. 5. Later on, such middle walls 11v can be removed, at least partly, together with other excess material 35, as illustrated in FIGS. 1E and 5.

FIG. 2 illustrates another class of embodiments, wherein layer portions 10 are grown so as for neighboring portions 10 to coalesce, as in lateral growth. The openings 7 and seeds used are advantageously distributed so as for portions 10 to coalesce vis-à-vis the lateral boundaries B of the cells C1, C2. They will thereby form a (first) coalesced film 10, which will typically exhibit a higher concentration of defects (forming defective regions 12) vis-à-vis the lateral boundaries B. As evoked above, additional layers 20 may later on be grown on top of layer 10, so as for portions 20 to coalesce and thereby form defective regions 22 vis-à-vis the lateral boundaries B, i.e., vis-à-vis and above the defective regions 12. Again, since such regions 12, 22 are later removed, see FIGS. 1E, 2E, they do not impact the quality of the structures 30 eventually obtained.

In each of the two classes of embodiments, lower portions 11l and/or walls 11v of the template structure 11 may be removed, if necessary and, this, while or after removing the excess material in layers 10, 20. This operation may be necessary to complete electrical connections, e.g., between the layer portions 10 and wires 5 already provided in the substrate 1, as illustrated in FIGS. 1D to 1E. However, in variants, the template structure 11 may already be suitably tiled or processed (prior to start growing the layers 10, 20), such that it may not be necessary to later remove excess portions in the lower structures 11l of the template 11. I.e., only the materials 10, 20 need be trimmed in that case, as assumed in FIG. 2.

Thus, to summarize, removing excess portions 35 may be performed so as for the optoelectronic structures 30 to eventually comprise, each, a stack of (residual) portions 11l, 10r, 20r. Such a stack may notably comprises a residual portion 20r (of a second layer portion 20), extending over a residual portion 10r (of a first layer portion 10), which itself extend over one or more lower portions 11l of the template structure 11 (as in FIG. 2E). If lower portions 11l of the template structure 11 need be partly removed (as in FIG. 1), then a residual portion 10r of the stack extends over one or more residual portions 11l of the template structure 11, see FIG. 1E.

In embodiments, it may be further needed to remove upper portions 11u of the template structure 11, in order to suitably expose the first layer 10, prior to growing subsequent layer(s) 20, as illustrated in FIGS. 1B to 1C and FIGS. 2B to 2C. Chemical mechanical polishing (CMP), plasma etching, or wet etching techniques may be used to that aim. The upper portions may typically include upper portions 11u that are parallel to the substrate. Yet, the removal of such upper portions 11u may further lead to trim upper portions of the lateral walls 11v, as illustrated in FIGS. 2B and 2C.

Several growth techniques can be contemplated, such as Metal Organic Vapor Phase Epitaxy (MOCVD), Hydride Vapor Phase Epitaxy (HVPE), or similar techniques. Which technique to choose depends on a number of parameters and is notably impacted by the dimensions of the various layers 11l, 10, 20 involved, starting with their thicknesses.

For example, if the apertures are deep, the first layer portions 10 need first be grown perpendicularly to the substrate 1 and then further grown parallel to the substrate, for said portions 10 to a least partly fill a respective cell. On the contrary, if the thickness of the lower sections 11l of the template structure 11 is small, relatively to the thickness of the layer 10 to be grown, then the growth of layer 10 essentially compares to a lateral growth (i.e., a growth parallel to the substrate). The type of growth may therefore depend on the thicknesses of the lower template structures 11l (which determines the depth of the apertures 7) and the layer 10 to be grown, amongst other parameters. As the skilled person knows, various types of growth can be contemplated, depending on the precise applications intended. What matters in the present general context is to select an appropriate growth technique, so as to make it possible to grow several layer portions 10 from openings 7, for them to a least partly fill their respective cells. Note that the growth of the various layer portions 10 need not necessarily be concomitant in the case of FIG. 1, although it preferably is, for efficiency reasons.

We note that, notwithstanding the depictions in FIGS. 1 and 2, subsequent growth steps are not limited to the growth of a single layer or to multiple layers of a same material 20. Rather, the material 20 as finally obtained in FIGS. 1 and 2 may be regarded as a multi-layer, e.g., comprising binary, ternary and/or quaternary III-V semiconductor materials. This is explicitly exemplified in FIGS. 3 and 4, wherein the fabrication process further comprises, after growing a coalescent film 20, steps for obtaining an additional film 20a of a compound semiconductor material, on top of layer 20 (FIGS. 3B and 4B). In variants (not shown), several, successive additional films (e.g., of respective, distinct compound semiconductor materials) may be similarly obtained, if necessary. Eventually, excess portions 35 are removed, which may comprise material portions of each of the layers 10, 20 and 20a. As before, the excess portions removed are those portions that extend vis-à-vis lateral boundaries B of the cells, so as to obtain clean, individual optoelectronic structures 30.

As further illustrated in FIGS. 3C and 4C, present methods may further comprise, in embodiments, steps aiming at structuring the topmost planar film 20a and, this, to partly expose the film 20 underneath, e.g., so as to form a contact layer 20a (FIGS. 3C, 4C) on top, as needed in photodetector applications.

Particularly preferred embodiments concern charge-coupled device (CCD) optical sensor arrays, e.g., CCD cameras, wherein III-V materials 10r, 20r are grown and shaped on a Si substrate 1. Such devices may be configured for infrared sensing capability.

For example, in embodiments, the structures 30 are structured as photodiodes, i.e., comprising an active layer 20 (e.g., comprising InP/InGaAs sub-layers), capped by doped InP layers, e.g., a p+ InP layer 20a, and a n+ InP layer 10, wherein the sandwich structure is suitably contacted by contacts 3, 40. As usual, an antireflecting coating may be needed.

In particular embodiments, the optoelectronic structures 30 are configured as an InGaAs dual-depletion region epitaxial structure, exhibiting (from top to bottom): a p+ metal contact; a 0.5-2 μm p+ InP cap layer; a 0.5-3 μm i InGaAs absorption layer; a 0.5-2 μm i InP drift layer; a 0.5-3 μm n+ InP substrate layer; and a n+ metal contact.

More generally though, the first compound semiconductor material 10 may comprise a binary III-V semiconductor material, while the upper layer(s) 20, 20a may comprise one or more of: a binary; a ternary; and a quaternary III-V semiconductor material. In typical applications, each of the first layer portions 10 and the upper layer 20a comprises a doped, binary III-V semiconductor material, such as InP.

The substrate 1 initially provided is preferably a CMOS-fabricated substrate (typically a Si substrate) that comprises wires 5 integrated therein. Such wires may for instance be part of a signal processing circuit, integrated in the substrate 1, to read/control electron charges from/to the device. As illustrated in FIGS. 1-2, at least some of the wires are arranged so as to be in electrical contact with lower portions 11l of the template structure 11. The connection of the structures 30 is typically completed by fabricating electrical conductors 40 connecting, each, a residual portion 20r to one of the wires 5 integrated in the substrate 1, as depicted in FIGS.

As further illustrated in FIGS. 1 and 2, the crystalline substrate 1 provided preferably comprises one or more fiducial markers 3, for use as a point of reference during the fabrication process, and in particular for trimming process. For example, the markers 3 may be used to precisely structure or pattern the template 11 on the substrate 1. Thus, the markers 3 are arranged at known relative positions from the template structure 11, e.g., in close proximity thereto. The geometry of the template 11 and cells C1, C2 is otherwise known. Thus, the position of the processing tools used to remove excess portions 35 may be calibrated based on the markers 3. Knowing the desired dimensions for the target structures 30, this tool can be used to precisely trim excess material 35 at positions determined relatively to the markers' positions.

According to another aspect, there is provided an optoelectronic device comprising an array 100-103 of optoelectronic structures 30, as depicted in FIGS. 1F, 2F, 3C, 4C and 6. This device is one that can be obtained according to any of the embodiments described above and, as such, it will exhibit footprints of such methods. In particular, such a device will typically have planar, well-defined and (essentially) defect-free layer portions 10r, 20r of compound semiconductor materials. Devices comprising III-V compound semiconductor materials are preferably contemplated. For instance, a subset (at least) of the optoelectronic structures 30 may be configured, each, as a photodetector, as evoked earlier. In variants, optoelectronic structures 30 may be configured as a light-emitting device, e.g., as a semiconductor laser. The structures 30, 30a may be differently structured and have different layer compositions, to fulfill different functions, as symbolically depicted in FIG. 6.

The novel fabrication methods and devices discussed herein may be used in photodetector or photo-emission applications, such as evoked above. In that respect, the present methods may, if necessary, further comprise steps to integrate arrays 100-103 into other structures. That is, the substrate obtained with optoelectronic structures thereon may be joined to another substrate, e.g., by wafer joining. This may notably be needed in optoelectronic applications involving mixed signal electronics with different technologies, which therefore require different substrates to be joined. For instance, an old technology node (say 90 nm), on which photodetectors are integrated may need be joined to a recent technology node (say 28 nm), in which the image processor is fabricated.

In addition, the present methods and devices may find applications in high frequency transistors (field-effect transistors, or high-electron-mobility transistors, etc.). Present devices may notably be used in power amplifiers in cell phones and radar. To that aim, the arrays 100-103 eventually obtained may be co-integrated with buried or adjacent CMOS signal processing processors.

The above embodiments have been succinctly described in reference to the accompanying drawings and may accommodate a number of variants. Several combinations of the above features may be contemplated. Examples are given in the next section.

2. Specific Embodiments

FIG. 1 shows 2D cross-sectional views illustrating high-level steps of a fabrication method of an optoelectronic device, wherein:

Individual crystals (or pixels) 10 are first grown in respective cells C1, C2 of a template structure 11, in close proximity to each other, FIGS. 1A-1B;

The template is then partially removed (upper portions 11u of the template 11 are removed), FIGS. 1B-1C;

An upper layer is overgrown to form a planar, coalescent film 20. This typically creates defects at the merging interface, but the defects can later be removed, as discussed in sect. 1. All the more, this approach makes it possible to use standard epitaxy processes for further layers, if necessary, as in full wafer epitaxy. On the contrary, if the pixels were already separated at the beginning, the epitaxy would be substantially modified around the periphery of each pixel, leading to variations in the thicknesses and compositions of the pixels, FIGS. 1C-1D;

The defective (merged) areas 22 are removed, thanks to a trimming process, which results in planar, (essentially) defect-free and isolated pixels, FIGS. 1D-1E; and Contacts 40 are then fabricated, to connect residual portions 20r of the active layer, FIG. 1F.

Figure 2E:
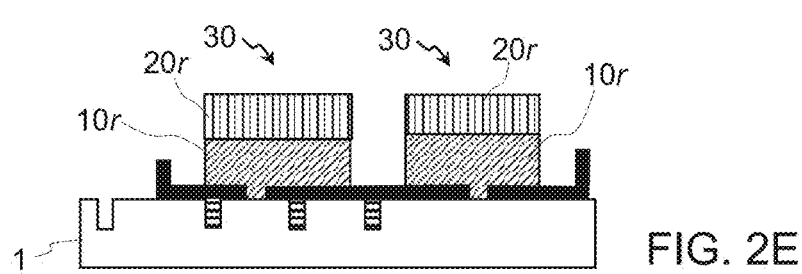
Figure 2F:
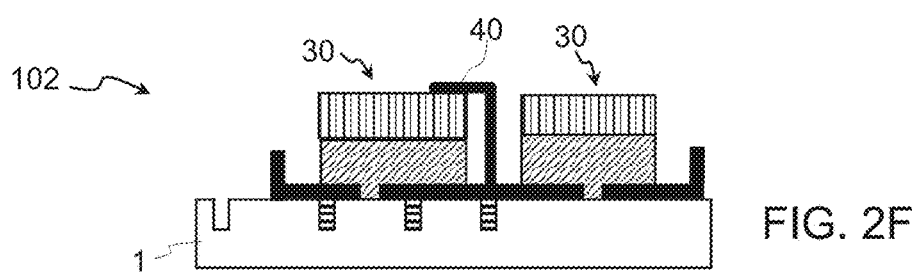

FIG. 2 shows 2D cross-sectional views illustrating high-level steps of a variant to the fabrication method of FIG. 1, wherein:

A III-V material is grown in merged template cells C1, C2 (not physically separated by lateral walls) from many seeds in apertures 7, until a coalescent film 10 is obtained, FIGS. 2A-2B. This again creates defects at the merged areas. A III-V binary material is preferably used to ensure a good control of composition;

The template is then partially removed (upper, horizontal portions 11u and upper portions of lateral walls 11v of the template 11 are removed), FIGS. 2B-2C;

A blanket overgrowth is carried out, in order to form a planar film 20, possibly multi-layered (and comprising binary, ternary and/or quaternary III-V materials with well controlled composition), FIGS. 2C-2D. This process step is similar to regular blanket growth, which makes it possible to ensure a well-controlled material composition;

The defective (merged) areas 12, 22 are removed, which again results in planar, (essentially) defect-free and well-defined, isolated pixels, FIGS. 2D-2E. Lower sections of the template are not trimmed in this example; and Contacts 40 are finally fabricated, as necessary, FIG. 2F.

FIGS. 3 and 4 depict another variant, wherein:

A dense array of first layer portions 10 are fabricated and upper sections of the template structure 11 are removed, FIGS. 3A, 4A;

Blanket-like epitaxies of the active material 20 and top contact 20a layers are carried out, FIGS. 3B, 4B; and Top contacts 20a are structured and the pixels trimmed, yielding residual portions 10r, 20r. The lower sections of the template are not trimmed either in this other example.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of fabrication of an array of optoelectronic structures, comprising:
    providing a crystalline substrate with a template structure thereon, wherein the template structure comprises cells corresponding to individual optoelectronic structures to be obtained, each of the cells comprising an opening to the substrate;
    growing several first layer portions of a first compound semiconductor material from seeds in each said opening, for each of said first layer portions to a least partly fill a respective one of the cells and form an essentially planar film portion therein;
    removing upper portions of the template structure to expose said first layer portions of first compound semiconductor material;
    growing several, second layer portions of a second compound semiconductor material over said first layer portions, for neighboring ones of said second layer portions to coalesce and thereby form a coalescent film extending over said first layer portions; and
    removing excess portions of materials extending over the substrate that exceed defined dimensions of the cells at lateral boundaries of the cells to obtain said array of optoelectronic structures,
    wherein each of the optoelectronic structures comprises a stack of: a residual portion of one of said second layer portions; and a residual portion of one of said first layer portions, the stack protruding from the substrate.

2. The method of fabrication according to claim 1, wherein
    growing said second layer portions is performed so as for said neighboring ones of said second layer portions to coalesce at locations corresponding to the lateral boundaries of the cells and form defective regions at said locations corresponding to said lateral boundaries.

3. The method of fabrication according to claim 1, wherein said lateral boundaries are defined by walls of the template structure, wherein said walls extend perpendicularly to an average plane of the substrate, and
    wherein growing the first layer portions is performed so as for said first layer portions to reach said walls, which form gaps between neighboring ones of the first layer portions grown.

4. The method of fabrication according to claim 1, wherein:
    growing the first layer portions is performed so as for neighboring ones of the first layer portions to coalesce at said locations corresponding to said lateral boundaries of the cells and thereby form a first coalesced film with first defective regions at said locations corresponding to said lateral boundaries; and
    growing said second layer portions is performed so as for said neighboring ones of said second layer portions to coalesce and form a second coalescent film extending over said first coalesced film and comprising second defective regions at locations corresponding to said first defective regions.

5. The method of fabrication according to claim 1, further comprising, while or after removing said excess portions,
    removing, at least partly, lower portions and/or walls of the template structure, wherein said lower portions extend parallel to an average plane of the substrate and are in mechanical contact therewith and said walls extend perpendicularly to said average plane.

6. The method of fabrication according to claim 1, wherein
removing excess portions is performed so as for said optoelectronic structures to comprise, each, a stack of: said residual portion of one of said second layer portions; said residual portion of one of said first layer portions; and one or more lower portions of the template structure, wherein said lower portions extend parallel to an average plane of the substrate and are in mechanical contact therewith.

7. The method of fabrication according to claim 1, wherein
growing said first layer portions comprises: growing first layer portions perpendicularly to an average plane of the substrate and then further growing said first layer portions parallel to said average plane, for said first layer portions to a least partly fill a respective one of the cells.

8. The method of fabrication according to claim 1, wherein the crystalline substrate provided comprises one or more fiducial markers, the latter arranged at known relative positions from the template structure, and
wherein removing said excess portions is performed according to said fiducial markers.

9. The method of fabrication according to claim 1, wherein said coalescent film is obtained as a blanket overgrowth.

10. The method of fabrication according to claim 9, further comprising: structuring an outermost one of said additional planar films to partly expose a film underneath.

11. The method of fabrication according to claim 1, wherein
said first compound semiconductor material comprises a binary III-V semiconductor material and said coalescent film comprises one or more of: a binary III-V semiconductor material, a ternary III-V semiconductor material; and a quaternary III-V semiconductor material.

12. The method of fabrication according to claim 1, wherein
the substrate provided is a CMOS-fabricated substrate that comprises wires integrated in the substrate, wherein at least some of the wires are arranged so as to be in electrical contact with lower portions of the template structure.

13. The method of fabrication according to claim 12, wherein
the method further comprises fabricating electrical conductors connecting, each, a residual portion of one of said second layer portions to one of the wires integrated in the substrate.

14. The method of fabrication according to claim 1, wherein
the method further comprises joining the substrate to another substrate.

15. An optoelectronic device comprising an array of optoelectronic structures as obtained according to the method of claim 1.

16. The optoelectronic device according to claim 15, wherein
at least a subset of the optoelectronic structures are configured, each, as a photodetector.

17. The optoelectronic device according to claim 16, wherein
at least a subset of the optoelectronic structures are configured, each, as a semiconductor laser.

18. The optoelectronic device according to claim 15, wherein
at least a subset of the optoelectronic structures are configured, each, as a light-emitting device.

19. A method of fabrication of an array of optoelectronic structures, comprising:
providing a crystalline substrate with a template structure thereon, wherein the template structure comprises cells corresponding to individual optoelectronic structures to be obtained, each of the cells comprising an opening to the substrate;
growing several first layer portions of a first compound semiconductor material from seeds in each said opening, for each of said first layer portions to a least partly fill a respective one of the cells and form an essentially planar film portion therein;
obtaining one or more additional films of respective compound semiconductor materials, extending over a coalescent film;
growing several, second layer portions of a second compound semiconductor material over said first layer portions, for neighboring ones of said second layer portions to coalesce and thereby form the coalescent film extending over said first layer portions; and
removing excess portions of materials extending over the substrate that exceed defined dimensions of the cells at lateral boundaries of the cells to obtain said array of optoelectronic structures by removing material portions of each of the first compound semiconductor material, the second compound semiconductor material, and said respective compound semiconductor materials at said lateral boundaries of the cells, to obtain said individual optoelectronic structures,
wherein each of the optoelectronic structures comprises a stack of: a residual portion of one of said second layer portions; and a residual portion of one of said first layer portions, the stack protruding from the substrate.

* * * * *